US008606538B2

(12) United States Patent
Cahon et al.

(10) Patent No.: US 8,606,538 B2
(45) Date of Patent: Dec. 10, 2013

(54) METHOD OF TESTING AN ELECTRONIC SYSTEM

(75) Inventors: Gilles Cahon, Velaux (FR); Christian Gaurel, Marseille (FR)

(73) Assignee: Eurocopter, Marignane Cedex (FR)

( * ) Notice: Subject to any disclaimer, the term of this patent is extended or adjusted under 35 U.S.C. 154(b) by 927 days.

(21) Appl. No.: 12/171,311

(22) Filed: Jul. 11, 2008

(65) Prior Publication Data

US 2009/0019311 A1    Jan. 15, 2009

(30) Foreign Application Priority Data

Jul. 13, 2007 (FR) ...................................... 07 05084

(51) Int. Cl.
*G01R 31/3183* (2006.01)

(52) U.S. Cl.
USPC ............ 702/123; 702/121; 702/182; 714/27; 714/33; 714/36; 714/E11.171; 714/E11.177; 717/124; 717/127; 717/135; 703/22

(58) Field of Classification Search
USPC .......... 702/27, 121, 123, 182; 714/27, 33, 36, 714/E11.171, E11.177; 717/124, 127, 135; 703/22
See application file for complete search history.

(56) References Cited

U.S. PATENT DOCUMENTS

| 5,223,788 | A | | 6/1993 | Andreano et al. |
| 5,910,895 | A | * | 6/1999 | Proskauer et al. ............ 700/121 |
| 5,963,889 | A | | 10/1999 | Irregger et al. |
| 6,598,002 | B1 | | 7/2003 | Claverie |
| 6,678,841 | B1 | * | 1/2004 | Kurosawa et al. ............. 714/57 |
| 7,240,303 | B1 | | 7/2007 | Schubert et al. |
| 2001/0039486 | A1 | * | 11/2001 | Horie et al. .................... 702/123 |
| 2005/0220029 | A1 | | 10/2005 | Calluaud et al. |
| 2005/0240794 | A1 | | 10/2005 | Sinha et al. |
| 2007/0067755 | A1 | | 3/2007 | Hinchey et al. |

FOREIGN PATENT DOCUMENTS

| EP | 0532017 A1 | 3/1993 |
| EP | 0827608 A1 | 3/1998 |
| EP | 0 827 608 | 11/1998 |

(Continued)

OTHER PUBLICATIONS

Amla, N. et al., "Using Z specifications in category partition testing", Proceedings of the Annual Conference on Computer Assurance (COMPASS). Gaithersburg, Jun. 15-18, 1992, New York, IEEE, US. vol. Conf. 7, Jun. 15, 1992, pp. 3-10, XP010060440.

(Continued)

*Primary Examiner* — Alexander H Taningco
*Assistant Examiner* — Paul D Lee
(74) *Attorney, Agent, or Firm* — Brooks Kushman P.C.

(57) ABSTRACT

A method of preparing a test for an electronic system including a plurality of pieces of equipment interconnected by at least one communications link, in which method, in order to perform the test, use is made of a test bench appropriate for the electronic system under test, which test bench is connected to the system and controlled in application of a command sequence established from at least one informal functional specification; while preparing the test, the informal functional specification, the command sequence, and a link identifying the informal functional specification from which the command sequence was established are all recorded so that after execution of the command sequence and after the test results have been recorded, it is possible to read the link and identify unambiguously the informal functional specification that corresponds to the test results obtained.

8 Claims, 9 Drawing Sheets

(56) References Cited

FOREIGN PATENT DOCUMENTS

| | | | |
|---|---|---|---|
| EP | 0985155 | A1 | 3/2000 |
| EP | 1583289 | A2 | 10/2005 |
| FR | 2658933 | A1 | 8/1991 |
| FR | 2764072 | A1 | 12/1998 |
| WO | WO 9637839 | | 11/1996 |

OTHER PUBLICATIONS

Amla N et al.: "Using Z specifications in category partition testing" Proceedings of the Annual Conference on Computer Assurance (COMPASS). Gaitherspburg, Jun. 15-18, 1992, New York, IEEE, US vol. Conf. 7, Jun. 15, 1992, pp. 3-10, XP010060440 ISBN: 0-7803-0579-5.

* cited by examiner

METHOD OF TESTING AN ELECTRONIC SYSTEM

The present invention relates to a system and to a method for testing an electronic system.

The technical field of the invention is that of fabricating helicopters.

BACKGROUND OF THE INVENTION

The present invention relates in particular to a system for testing an electronic system that comprises a plurality of pieces of electronic equipment together with one or more interconnection structures interconnecting said pieces of equipment.

The invention applies in particular when interconnection is performed by one or more communications buses and/or links that is/are implemented to comply with one or more standards taken from the following: MIL-STD-1553 (A or B); STANAG 3350; STANAG 3838; STANAG 3910; ARINC 429; ARINC 453; ARINC 629; ARINC 636; MIL-STD-1773; AFDX; ASCB; CSDB; IEEE P1014; RS232; RS422; RS485.

Electronic systems on board aircraft and rotorcraft generally include a plurality of computers connected in particular to sensors, to actuators, and to displays.

Testing such systems for proper operation is complex and lengthy, and is consequently expensive.

It is difficult to prepare and carry out such tests, in particular because of the large amount of signals and data that are exchanged by the pieces of equipment while they are in operation, and because of the large number of possible configurations for the pieces of equipment constituting the electronic system, e.g. depending on whether the electronic system is designed for fitting to an aircraft having no weapons system, or on the contrary for fitting to an aircraft having a weapons system.

Patent EP-0 532 017 describes a test system for electronic equipment, the test system comprising a generic test controller GTC together with a functional interface unit FIU that is specific to a particular weapons system, each connected to an interface panel with apparatuses under test and communicating via an IEEE-488 bus. The generic controller GTC and the specific unit FIU are each connected to analog and digital input/output (I/O) cards or instruments via an IEEE-796 bus. The GTC controller has interface cards with the 1553 bus that are capable of operating as bus controllers, as terminals, or as a bus monitor. Test programs can be modified and compiled by a central computer via an RS232 link, and recorded on a storage unit that is connected to the microprocessor unit of the GTC controller, as in an operator interface.

Patent EP-0 827 608 describes a method of testing electrical circuits in which the test program is split into an element relating to the test sequence that calls on data contained in a test data field, and an element relating to controlling the test device.

Patent EP-0 985 155 describes a test method in which an operator inputs information to define a command sequence for application to a test device connected to a piece of equipment for testing. For each command of the command sequence, the operator inputs a command number, a command type, parameters or variables for the command, and an expected result for the test corresponding to said command. To do this, the operator is assisted both by a dictionary of the various types of commands that are applicable to the equipment for testing, and also by a database combining the variables contained in the arguments of the commands and the values that each variable can take. Thereafter, the operator can cause the input command(s) to be executed by the test device and can archive the test results. The test device can undertake analysis to verify that a command type as input is to be found in the dictionary, that the arguments present a syntax that corresponds to that in the dictionary, and that the variables as input are to be found in the variables database.

Patent EP-1 583 289 describes a system for simulating and testing an AFDX network that can be used for simulating one or more pieces of equipment using "off-the-shelf" equipment.

Known methods and systems for simulation and/or testing are generally designed to test a narrow range of pieces of equipment.

The purpose of testing an on-board electronics system (avionics system) is to verify that the functions allocated to the system are indeed fulfilled. These functions are generally defined in informal manner. From such a definition, a human being, a test operator, can generate a command sequence for a test device (or "test bench"), e.g. as described in patent EP-0 985 155.

Given the complexity of the system for testing, a complete sequence of commands that is sufficient for testing a determined function of the system can comprise one or more thousands of commands.

Generating command sequences for applying to the test apparatus requires the skills of a highly-qualified human operator. Because of the wide variety of the pieces of equipment that form part of an avionics system, it is difficult if not impossible to find an operator who is fully qualified for all of the kinds of equipment in the system and for all of the functions that the system as a whole is called on to perform. It is therefore generally necessary to rely on a plurality of operators selected for their high levels of qualification but each concerning some only of the pieces of equipment and/or the functions to be tested.

Developing an on-board electronics system often requires testing of the suitability of the system to perform some determined function to be performed successively on several occasions.

In particular because of the informal nature of the definition of a function that is to be performed by such an electronics system, it is quite possible for two distinct operators to produce two different sequences of commands, and for the execution of those two sequences of commands to produce different test reports.

In addition, for a given command, two distinct operators may select two distinct values for such-and-such a parameter or variable of that command, thereby likewise producing two different test reports. Comparing such test reports can be meaningless or can lead to a wrong conclusion.

OBJECTS AND SUMMARY OF THE INVENTION

An object of the invention is to provide a method and/or a system for testing and simulating a complex electronic system while improving and/or remedying, at least in part, the shortcomings or drawbacks of previously known test methods and systems.

In an aspect of the invention, there is provided method of preparing a test of an electronic system comprising a plurality of pieces of equipment interconnected by at least one communications link, in which method, performance of the test comprises:

using a test bench that is adapted to the electronic system for testing and that is connected to the system under test; and controlling the test bench in application of a sequence of commands (Scenario_text_file) established from at least one informal functional specification (Functional_chain);

and preparation of the test comprises:

creating the sequence of commands (Scenario_text_file) from a test procedure (ATP, Test_Procedure) containing a sequence of objects provided with attributes, at least one of the objects being provided with a frame attribute defining a sender and a receiver amongst the pieces of equipment of the system (SE), and enabling a data transfer format to be defined between the sender and the receiver; and recording the informal functional specification (Functional_chain), the command sequence (Scenario_text_file), and at least one link (Link) identifying an informal functional specification (Functional_chain) from which at least a portion of the command sequence was established, such that after executing the command sequence and recording the test results, it is possible to read the link (Link) and identify unambiguously the informal functional specification(s) (Functional_chain) corresponding to the test results obtained.

According to preferred characteristics of a method of the invention:

the informal functional specification (Functional_chain) may be recorded in the form of a text file;

the command sequence (Scenario_text_file) may be recorded in the form of a text file;

the link (Link) may comprise the address of at least part of the command sequence (Scenario_text_file)—or the address of a file containing at least part of said sequence—and the address of the informal functional specification (Functional_chain)—or the address of a file containing said specification—;

the command sequence (Scenario_text_file) is created from a test procedure (ATP, Test_Procedure) containing a sequence of objects having attributes;

the test procedure (ATP, Test_Procedure) may contain simulation objects (TestSimu), observation objects (TestSpy), check objects (TestCheck), and/or function-for-testing objects (TestFunct);

the test procedure (ATP, Test_Procedure) contains hierarchical organization data concerning the object, in particular hierarchical organization data for function-for-testing objects (TestFunct);

when creating a command sequence (Scenario_text_file) from a test procedure (ATP, Test_Procedure) containing simulation objects (TestSimu), observation objects (TestSpy), and check objects (TestCheck), these objects are selected from objects (POIL_BAR) recorded in a database (Interf_DB) of the system for testing, the database containing configuration data for pieces of equipment and for data exchanges between the pieces of equipment.

In this database, an object is defined by a unique name; amongst these objects, objects involving data transfer by one of the links and/or buses of the system for testing present a frame attribute that defines a unique sender piece of equipment and a unique receiver piece of equipment. The database also contains the information needed for defining the physical signal exchanged between the sender and the receiver of the system for testing, in particular the period and the format of the frame.

In another aspect of the invention, there is provided a method of performing a test on an electronic system comprising a plurality of pieces of equipment interconnected by at least one communications link, in which the test is prepared by a method of the invention, and then the following steps are performed:

connecting the test bench to the electronic system for testing;

reading a command sequence (Scenario_text_file) and controlling the test bench in compliance with the command sequence (Scenario_text_file);

recording test results in a file (Res_File); and associating with the test results at least one functional specification (Functional_chain) linked to the command sequence (Scenario_text_file) by a previously-recorded link (Link).

In another aspect of the invention, there is provided a method of testing an electronic system comprising a plurality of pieces of equipment interconnected by at least one communications link, in which method the test is prepared by:

preparing a formal test procedure (ATP, Test_Procedure) that is connected by one or more links (Link) to one or more functional definitions (Functional_chain) of requirements for the system (SE); and automatically producing a test scenario (Scenario_text_file) enabling a suitable test bench that is connected to the system for testing to be controlled by using a database (Interf_DB) containing definitions for all of the signals that might be exchanged by the pieces of equipment of the system; and then after the preparation, executing the test scenario (Scenario_text_file) on the test bench while checking and recording in an execution report (Res_File) the state of the system compared with the description provided in the test scenario; and automatically transcribing the results of the execution report into the test procedure (ATP, Test_Procedure, ATR), with the link (s) making it possible to identify unambiguously all of the requirements of the system (SE) that have been tested by executing the test scenario and that correspond to the results obtained.

The invention makes it possible to produce automatic traceability reports between the test results (Res_File, ATR) and the functional requirements of the system, and makes it possible to ensure that the description of the tests, as given by the procedure ATP, Test_Procedure, accurately matches the execution of the test on the system for testing.

At least some of the operations of the preparatory stage and/or of the test stage proper in methods of the invention can be implemented by an electronic data processor unit such as a computer operating under the control of a program.

Thus, in another aspect of the invention, there is provided a program comprising code recorded on a medium—such as a memory—or embodied by a signal, the code being readable and/or executable by at least one data processor unit—such as a processor—for simulating and testing the operation (good or bad) of a complex electronic system, the code comprising code segments for performing operations of a method of the invention.

In another aspect of the invention, there is provided a system for testing a complex electronic system, which test system is programmed to execute the operations of a method of the invention.

BRIEF DESCRIPTION OF THE DRAWINGS

Other aspects, characteristics, and advantages of the invention appear from the following description given with reference to the accompanying drawings that show preferred and non-limiting embodiments of the invention.

MORE DETAILED DESCRIPTION

Figure 1:
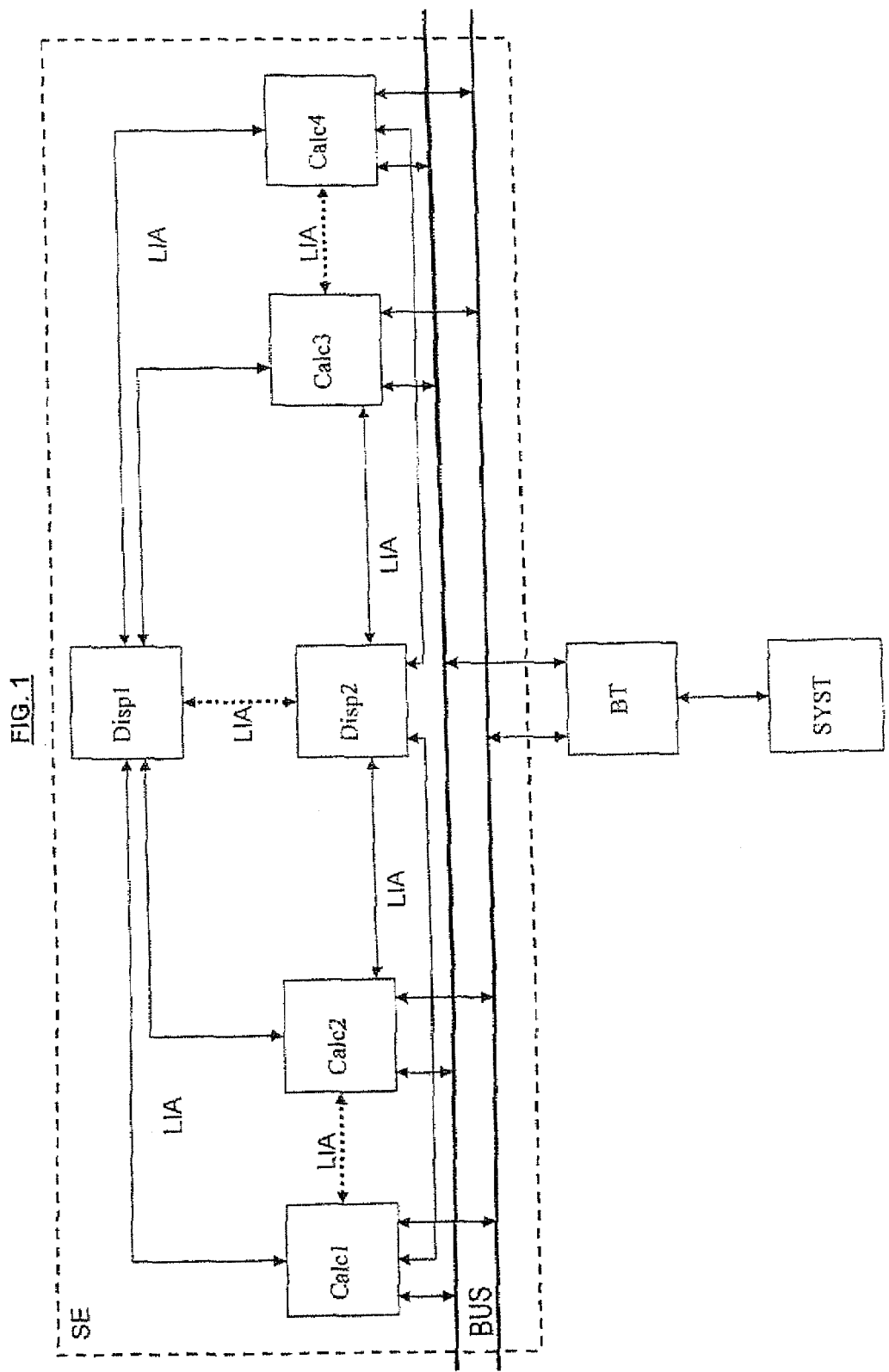
FIG. 1 is a block diagram of a test system connected to the bus of a rotorcraft electronic system comprising redundant computers interconnected by a redundant bus.
Figure 2:
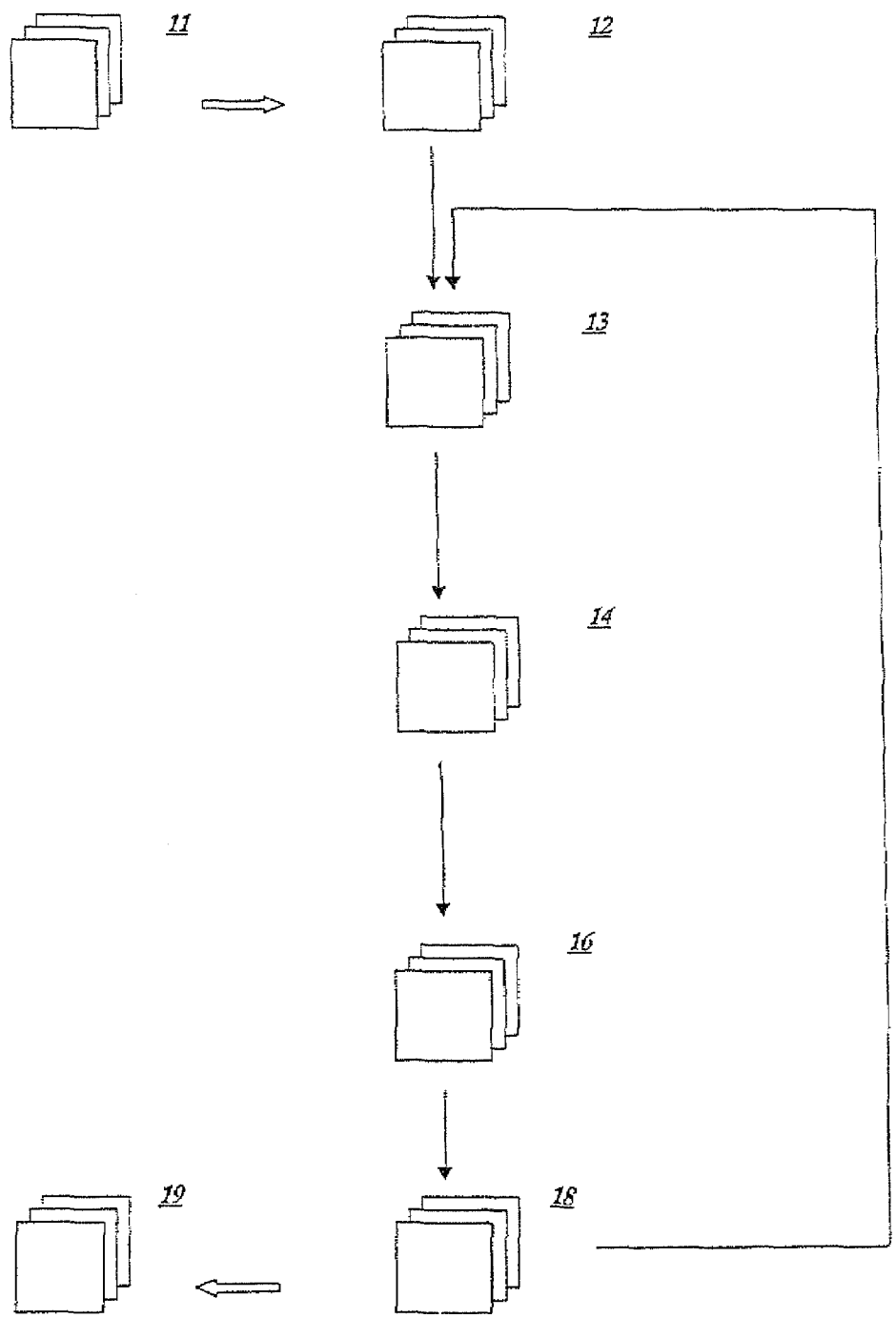
FIG. 2 is a diagram showing the sequence of steps in a method of preparing a test and in a test method of the invention.

With reference to FIG. 1 in particular, the invention applies to an electronic system SE of a rotorcraft, which system includes two redundant computers CALC1 and CALC2 having the function of managing the system SE.

The system SE also includes two other redundant computers CALC3 and CALC4 having the function of managing the operations of the engine(s) of the rotorcraft.

In order to keep the figure clear, other computers and pieces of electronic equipment that normally form part of the avionics SE of a rotorcraft, such as equipment for navigation and for communications, are not shown in this figure.

The system SE also includes two multifunction displays DISP1 and DISP2.

The computers of the system SE are connected to a redundant bus BUS, for example a MIL-STD-1553 bus. The computers are also interconnected by one or more point-to-point links LIA, such as RS485 or ARINC 429 links. Each computer is also connected by a link LIA to each of the two displays.

Figure 6:
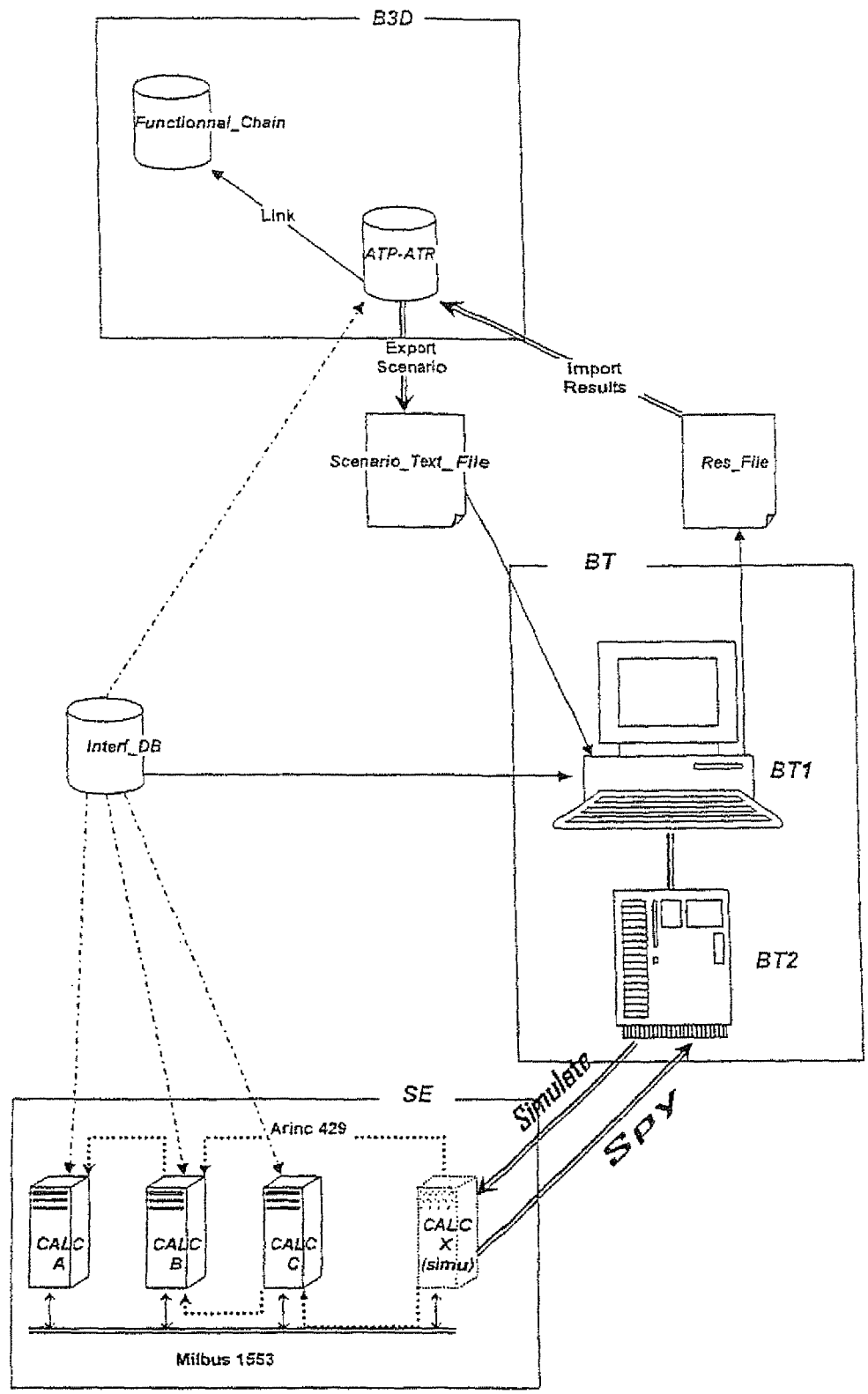
FIG. 6 is a diagram showing the modules of a test system of the invention.

As shown in FIGS. 1 and 6, in order to test the system SE and/or to simulate operation of one or more pieces of its equipment, a test bench BT is connected to the bus BUS of the system SE.

With reference to FIG. 6, the test bench BT may comprise a computer BT1 operable by an operator performing a test, and a test bay BT2 controlled by the computer BT1.

The bay BT2 is connected to the bus of the system SE under test in order to simulate a piece of equipment of the system SE, such as the computer CALCX shown in dotted lines in FIG. 6, and to monitor/record the signals/data exchanged by the pieces of equipment of the system SE during a test.

The bay BT2 may comprise a microprocessor control unit, analog and digital input/output (I/O) units, and interfaces suitable for enabling it to be connected to the bus BUS and also to the links LIA. The components of the bay BT2 may themselves be interconnected by a bus VME, for example.

In order to test and/or simulate the system SE, the test bench BT is connected to—and controlled by—a test system SYST in accordance with the invention that delivers for this purpose to the bench BT signals and/or data corresponding to test command sequences, and that subsequently receives from the bench BT signals and/or data corresponding to the results of executing the commands.

The test system SYST includes (cf. FIG. 6) a document database B3D including test procedures ATP, test procedures ATR allocated to the results of the corresponding tests, functional specifications Functional_chain containing functional requirements for all or part of the systems to be tested, and a database Interf_DB containing the specifications for signal/data exchanges—via the bus and the connections BUS, LIA—between the various pieces of equipment CALCA, CALCB, CALCC, CALCX of the system SE.

In an aspect of the invention, a formalized test procedure is defined in the form of a set of objects in a database and is linked to documents specifying the requirements of the system that is to be tested. A test scenario—or sequence of test commands—is automatically generated from the test procedure and is then executed on the test bench in real time with the results being recorded automatically; the invention enables complete traceability to be provided, from the system specification to the test results.

Classes of objects are created in the database in order to formalize the complete description of all of the operations that are to be performed while executing a test. These operations may be of the manual type (verification of the behavior of a piece of equipment of the system by the test engineer) or of the automatic type (simulating or spying a data value conveyed in the data stream of the system). Tests are subdivided into "individual" tests (i.e. the smallest portions of the procedure that can be executed individually).

The preparation and the execution of a test command sequence under the control of the system SYST may comprise the following successive steps that are themselves sequenced in the manner shown diagrammatically in FIGS. 2 to 5:

in a database of objects that have attributes, a test procedure is created by inputting information (step 13) and/or by importing (step 11) informal data specifying functions to be performed by the system SE, which data is contained in a text or a table, for example, followed by formatting (step 12) the informal data to comply with the format of the object database;

thereafter, there is defined (step 14), for the test procedure or for at least one object of said procedure, a link between the object (or the procedure) and an informal function specification;

in order to execute the test (step 16), at least one sequence of commands is generated from the test procedure, the commands are delivered to the test bench, the results of the test returned to the system SYST by the bench BT are recorded, and the attributes of the test TestCheck objects are modified automatically as a function of these results; and a report is drawn up (step 18) summarizing the tests performed and the report is exported (step 19) where appropriate to some other application.

Figure 9:
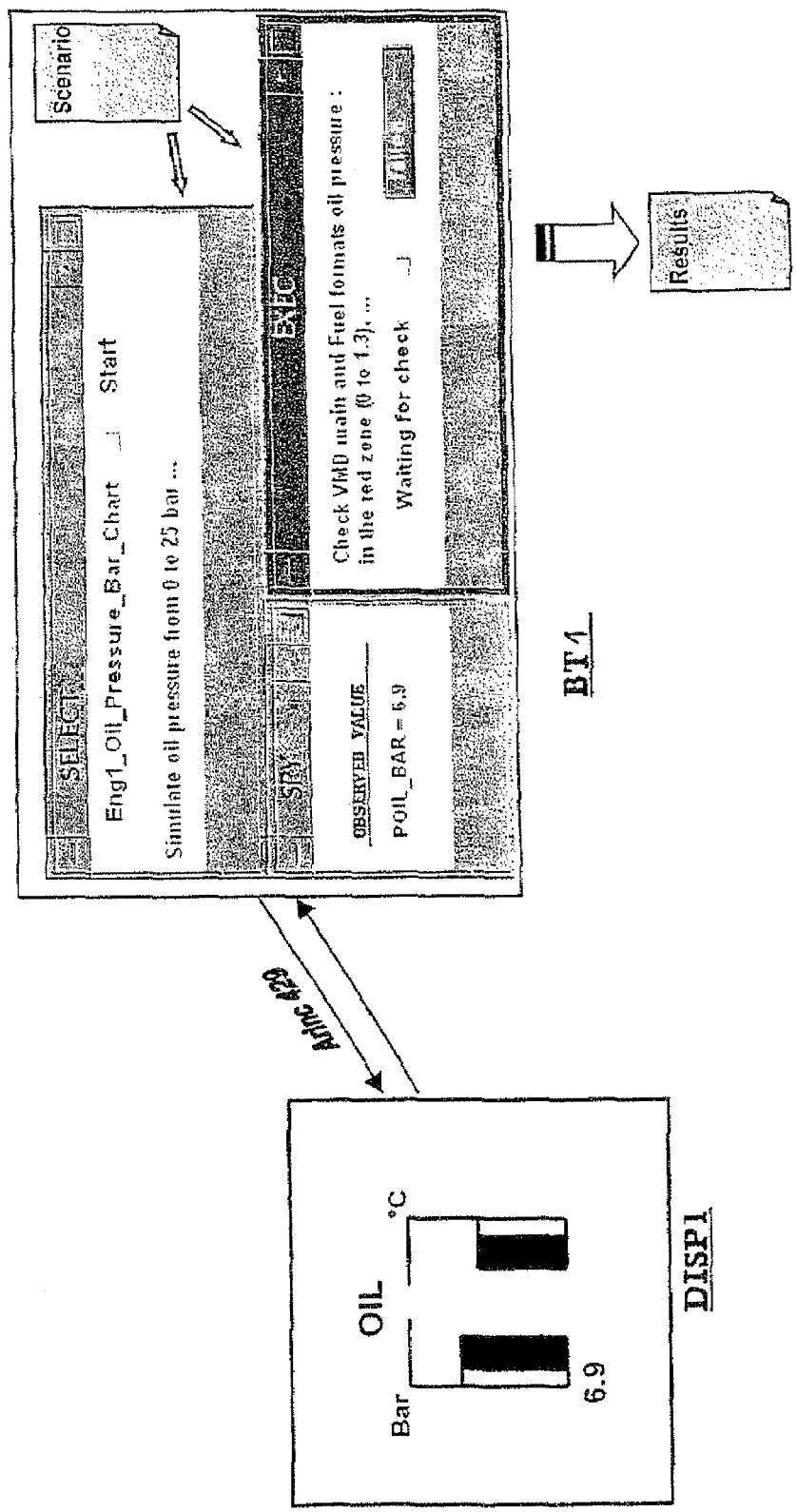
FIG. 9 is a diagram showing an example of a graphical interface presented to an operator performing a test prepared in accordance with the invention.

With reference to FIGS. 3 and 7 to 10 in particular, a test procedure comprises at least one hierarchical sequence of objects belonging to different classes of objects, such as, for example:

a TestFunct class of objects, each containing a title relating to a portion of the procedure, such as "1.1 engine t 700 status monitoring" or "1.1.1 engine ½ oil pressure bar chart";

a TestIdent class of objects, each containing an individual test identifier such as "[engl_oil_pressure_bar_chart]" which is presented (in the window SELECT FIG. 9) to an operator executing the procedure;

a TestDesc class of objects, each containing a description of the corresponding portion of the procedure such as "simulate oil pressure from 0 to 25 bar and then going below 3 bar for checking displayed warnings and cautions"; this description also being presented in the window SELECT, FIG. 9;

a TestProc class of objects, each containing an instruction message such as "power on PMC and check MFD oil pressure display according to simulated value" for informing an operator executing the procedure of the action the operator is to carry out on the system SE under test; this message may be presented to the operator in a window similar to the window EXEC in FIG. 9;

a TestSimu class of objects, each containing a test bench command such as "POIL_BAR=LIST(0, 0.1, 1.2, 1.3, 1.4, 2.1, 1.2, 5.8, 6.9, 8.2, 8.3, 25)" for causing the test bench to send to at least one piece of equipment in the system SE under test, via the bus BUS or one of the links LIA, data, e.g. data simulating a signal delivered by a sensor, in order to simulate the sensor;

a TestSpy class of objects, each containing a bench test command, such as "POIL_BAR" for causing at least one piece of equipment in the system SE under test to send to the test bench via the bus BUS or one of the links LIA data that is delivered by said piece of equipment for the purpose of monitoring it; the data is presented to the operator while the test is being performed in the window SPY, FIG. 9; and a TestCheck class of objects, each containing an instruction for verifying the state of the system SE under test that is to be performed by the operator, such as "Check VMD main . . . of digital value at 3 bar.", to cause success observed data to be recorded "passed" or failure data to be recorded "failed" that can be input by the operator during the test, in the window EXEC, FIG. 9.

Figure 3:
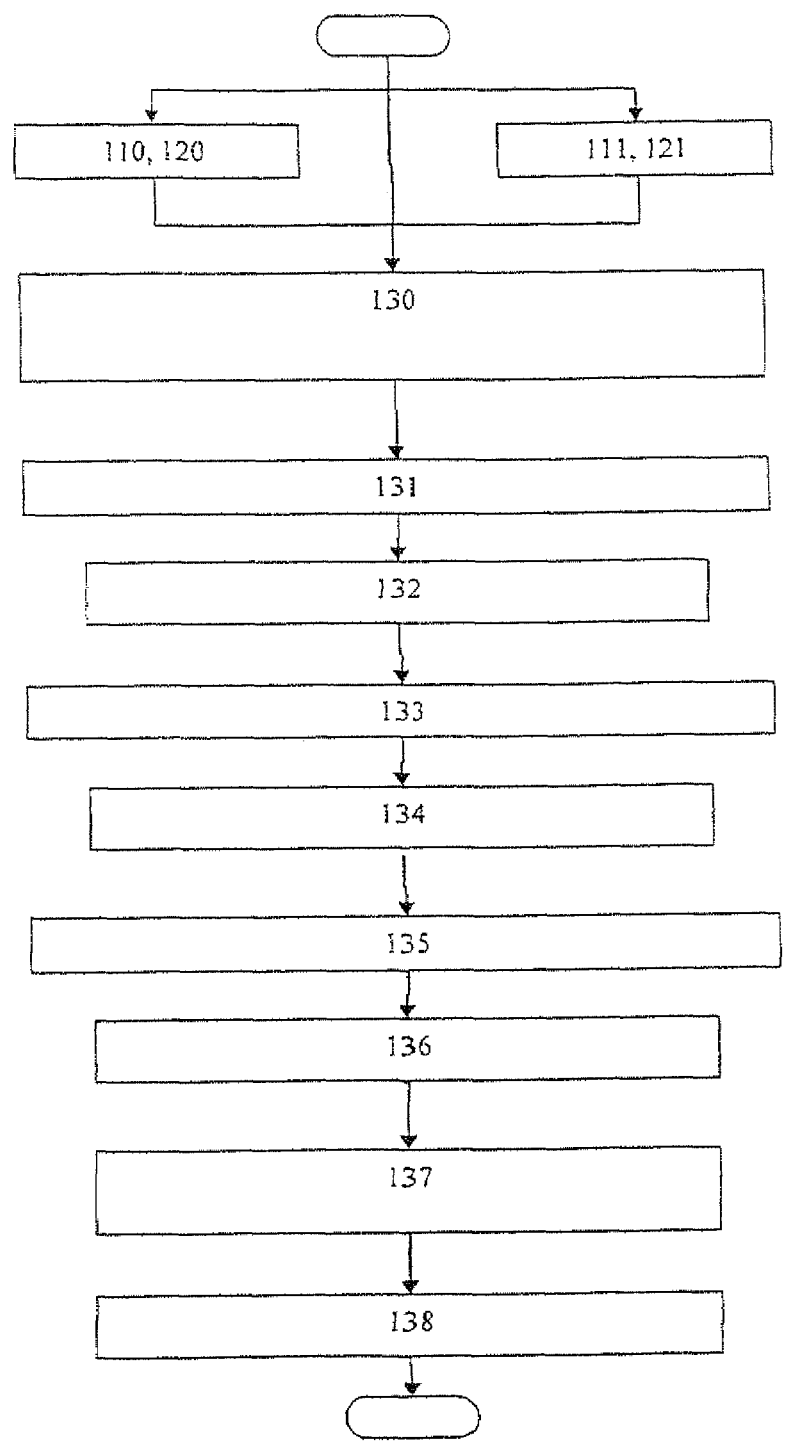
FIG. 3 is a diagram showing the sequence of steps for setting up a test procedure in a method of the invention for preparing a test.

In the embodiment corresponding to FIG. 3, object definition data is imported, where appropriate, from a spread sheet (operations 110, 120) or from a text file (operations 111, 121); thereafter TestFunct, TestIdent, TestDesc, and/or TestProc objects are input, selected, extracted or formatted (operation 130).

The same input/import operation is performed for the TestSimu and TestSpy objects (operations 131 and 133 respectively), with the format and the content thereof being verified (operations 132 and 134 respectively) by comparison with data from the database Interf_DB.

The content of the TestCheck objects is also input (operation 135) and attributes are modified or added (operation 136) in some or all of the objects.

Thereafter, it is possible to create and record (operation 137) a link between the procedure defined by a sequence of these objects and one or more functional specifications in natural language corresponding to the objects, and then to record (operation 138) the procedure as defined in this way ATP, Test_Procedure.

Other classes of objects may be provided, for example a class of object each containing a description or an identification of determined test means that needs to be included in the test bench in order to perform a determined test.

Figure 7:
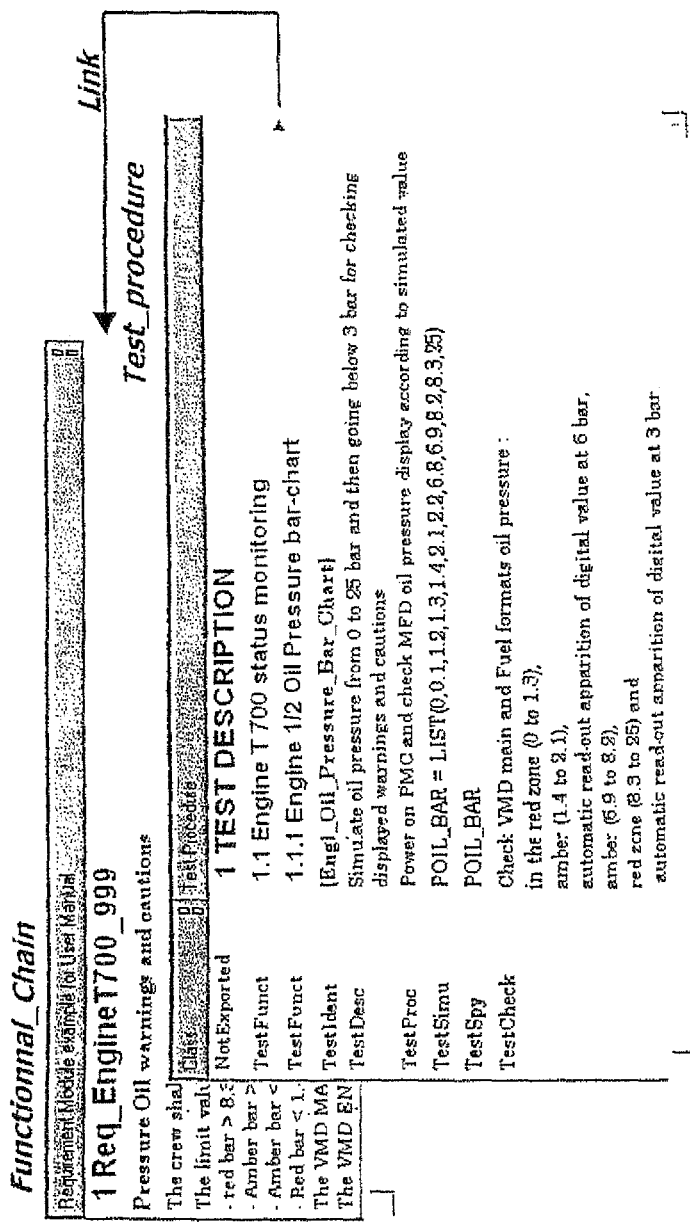
FIG. 7 shows an example of a test procedure structure in a method of the invention and its link with an informal functional specification.
Figure 8:
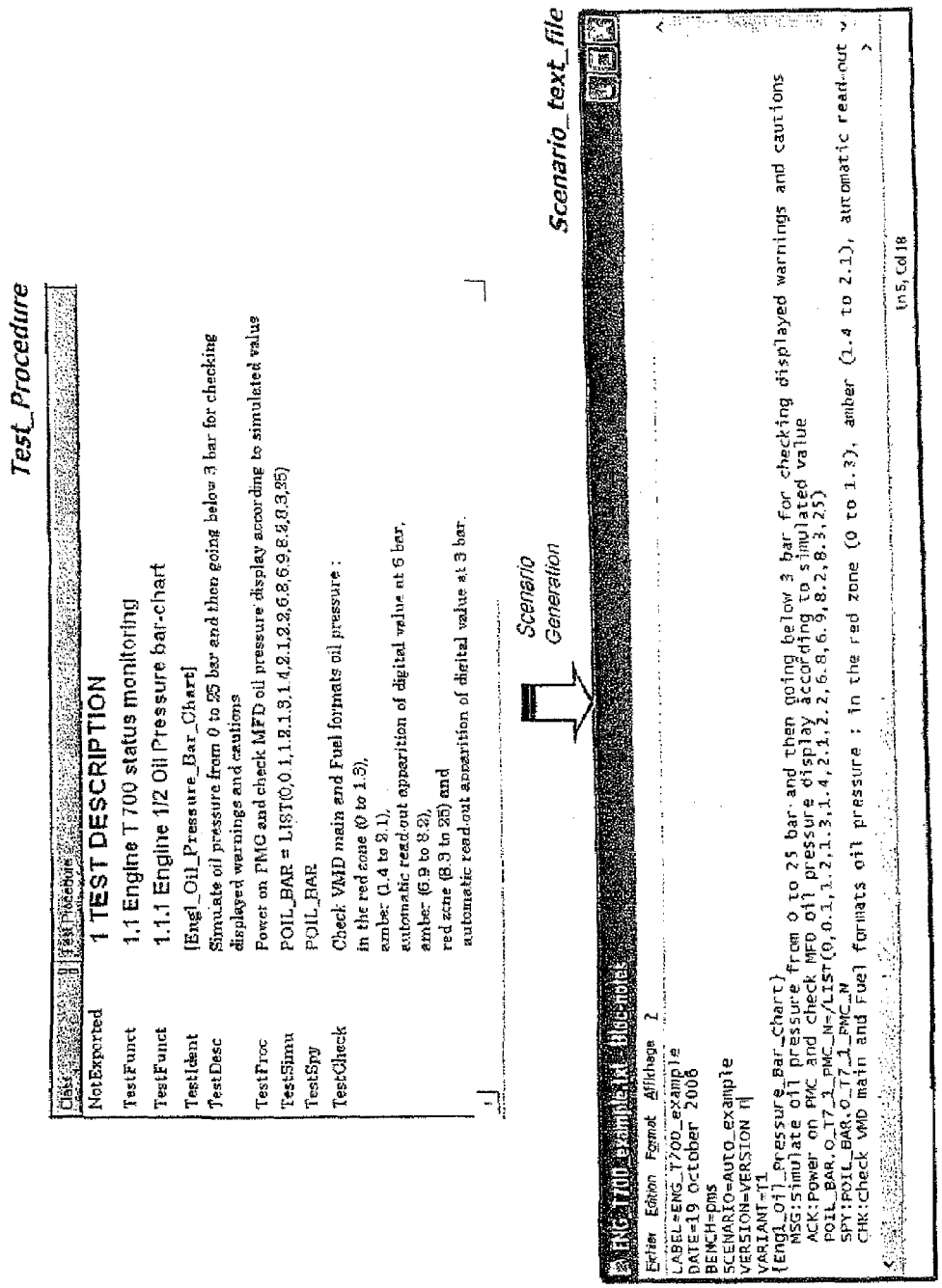
FIG. 8 shows the use of the FIG. 7 test procedure for automatically generating a sequence of test commands in accordance with an aspect of the invention.
Figure 10:
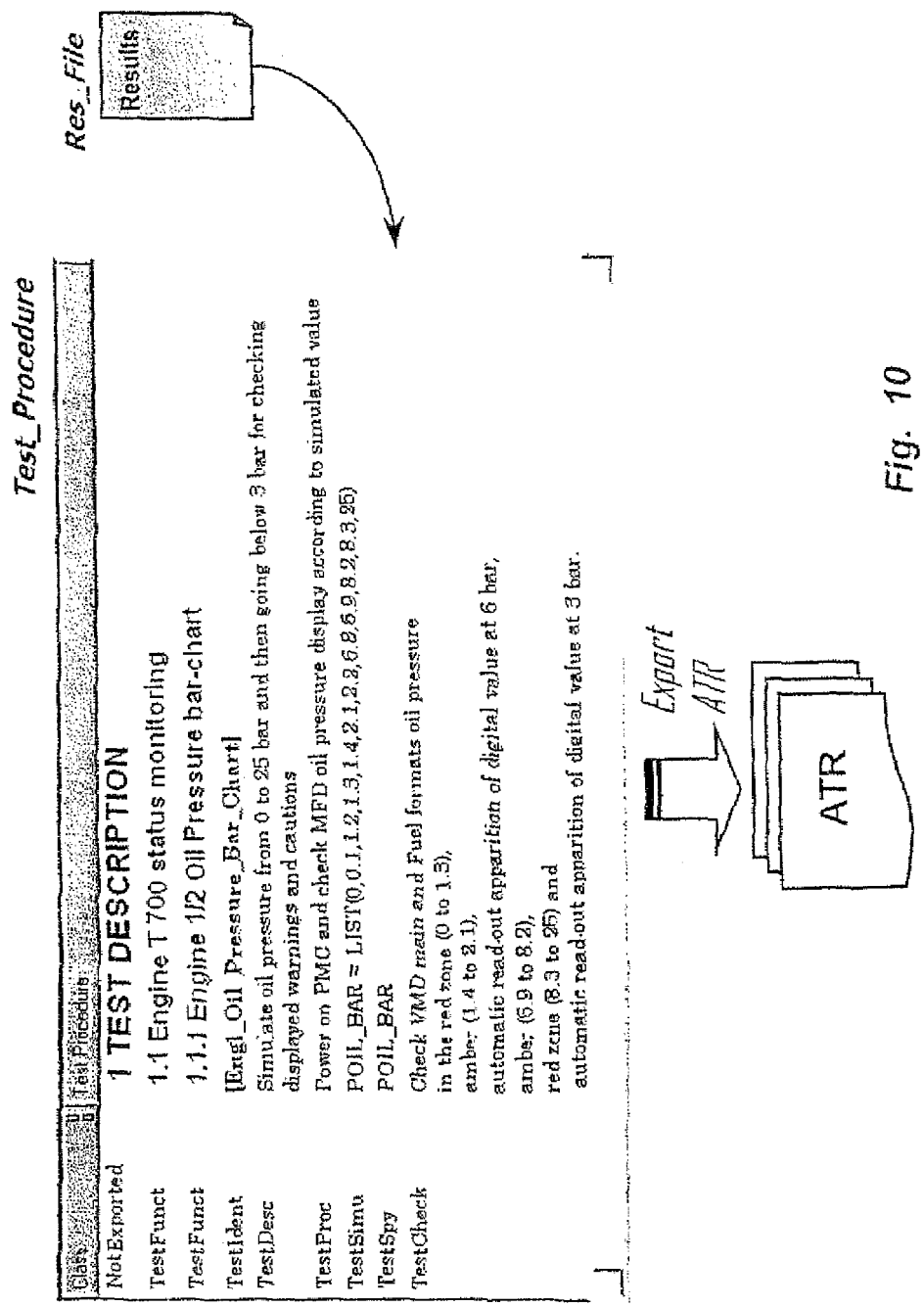
FIG. 10 is a diagram showing the preparation of a test report and a function of test results and of the corresponding test procedure.

FIGS. 7, 8, and 10 give an overview of the content of the document database defining tests in the form of a table in which the data corresponding to one object occupies one row. The class of object appears in a first column (left-hand column FIGS. 7 and 8), the content of the object appears in a second column, and the attributes of the object appear in other columns.

Amongst these attributes, there is provided in particular a frame attribute for the object of the TestSimu and TestSpy object classes, in particular. During automatic generation of a sequence of test commands from a procedure including an object presenting this attribute, the attribute is used to adapt the test command to a protocol—i.e. a data exchange format—that matches the protocol used by the pieces of equipment in the system SE for communicating. The frame attribute is used to specify the physical routing defined on the test bench.

By way of example, and as shown in FIG. 8, such a frame attribute associated with the TestSimu object containing the command "POIL_BAR=LIST(0, 0.1, 1.2, 1.3, 1.4, 2.1, 1.2, 6.8, 6.9, 8.2, 8.3, 25)", causes, on creation of a command file in the text format shown in the bottom box of this figure, the content of said command to be modified so that it becomes "POIL_BAR.O_T7__1_PMC_N=/LIST(0, 0.1, 1.2, 1.3, 1.4, 2.1, 1.2, 6.8, 6.9, 8.2, 8.3, 25)".

Amongst these attributes, there is also provided a result attribute for the objects of the TestCheck object class in particular. This attribute may be modified while automatically generating a test report in order to include the result, such as the result "failed" in FIG. 10, relating to a verification performed by the operator during the test.

Figure 4:
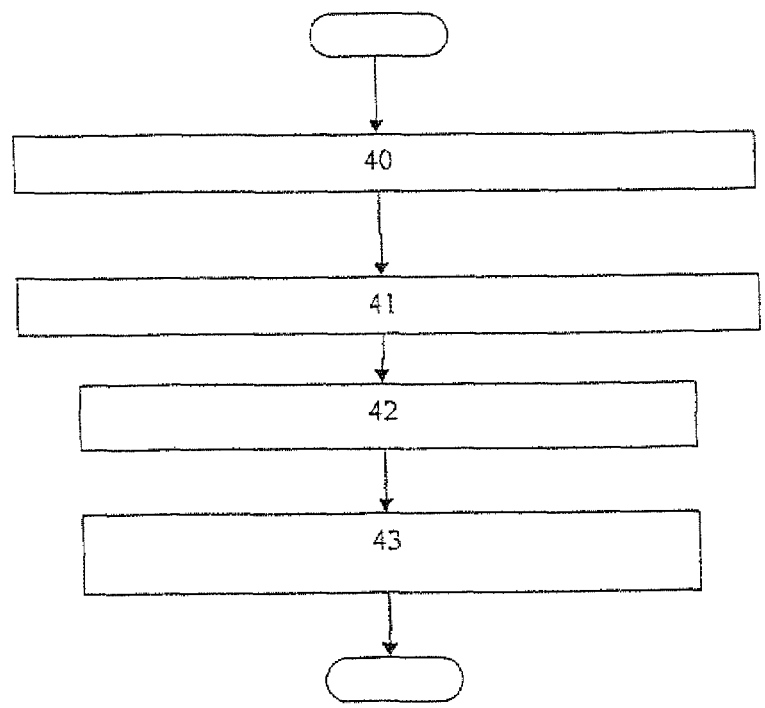
FIG. 4 is a diagram showing the sequence of steps for setting up a sequence of test commands from a test procedure in a method of the invention for preparing a test.

With reference to FIGS. 4 and 8, a text file having a particular syntax is generated by extracting from the text of the procedure all of the instructions that are to be used on the real time test bench.

To this end, it is possible to proceed in succession with reading (step 40) a test procedure ATP, Test_Procedure, reading (step 41) a configuration of the test bench, reading (step 42) a configuration of the system to be tested, creating (step 43) and recording a sequence of commands corresponding to said procedure and to said configurations.

Figure 5:
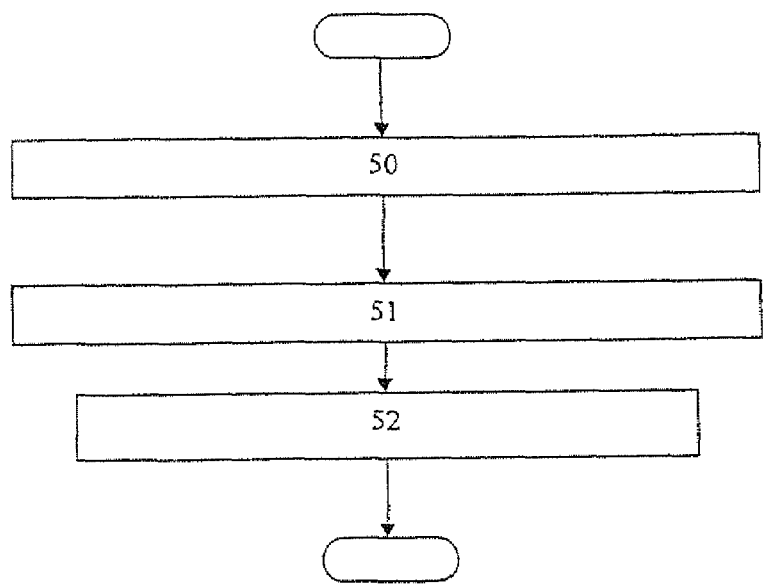
FIG. 5 is a diagram showing the sequence of steps for executing a test procedure in a test method of the invention.

In order to execute the test shown in FIG. 5, a generic scenario can read/interpret (step 50) the text file of test instructions. It serves to execute (step 51), optionally sequentially, all of the individual tests described in the associated procedure and to record (step 52) results during the test in another text file.

With reference to FIGS. 6 and 10 in particular, the text file Res_File (FIG. 6) containing the results of the test is then used for automatically updating the test report in the document database. This is then used for producing a final acceptance document known as an acceptance test report (ATR) combining the test procedure ATP used together with the results obtained during execution of the sequence of commands corresponding to said procedure ATP.

With reference to FIG. 9, while executing a test, dialog and input windows SELECT, SPY, and EXEC are presented to the operator on the screen of the computer BT1 of the test bench BT, of existence and content that results respectively from the existence and the content of the above-described objects of the TestIdent, TestDesc, and TestProc classes.

The management of these windows is controlled by the command sequence, and the test results are recorded in the results file Res_File (FIG. 6).

The invention makes it possible to ensure that tests are performed exactly as defined in the procedure. This makes it easier to execute non-regression tests.

The tests may be executed by an operator who does not have in-depth knowledge of the system SE under test.

The invention also enables complete traceability to be provided for the process from the application of the procedure: traceability is ensured between the systems specifications and the results of the validation procedures via the document database and the automatic test scenarios.

What is claimed is:

1. A method of testing an aircraft electronic system having a plurality of pieces of equipment interconnected by at least one communications link in which method, performance of the test comprises:

using a test bench that is adapted to the electronic system for testing and that is connected to the electronic system under test; and controlling the test bench in application of a sequence of commands (Scenario_text_file) established from at least one informal functional specification (Functional_chain) for the electronic system to thereby generate test results of the electronic system;

and preparation of the test is characterized by automatically:

preparing a test procedure (ATP, Test_Procedure) that is connected by links (Link) to one or more informal functional specifications (Functional_chain) for the electronic system, the test procedure (ATP, Test_Procedure) containing a sequence of objects provided with attributes, at least one of the objects being provided with a frame attribute defining a sender and a receiver amongst the pieces of equipment of the electronic system and enabling a data transfer format to be defined between the sender and the receiver;

wherein the sequence of objects contained in the test procedure include simulation objects (TestSimu), observation objects (TestSpy), and check objects (TestCheck), the sequence of objects being selected from objects recorded in a configuration database (Interf_DB) for the electronic system, the configuration database containing configuration data for the pieces of equipment and for data exchanges between the pieces of equipment including definitions for all of the signals that might be exchanged by the pieces of equipment of the electronic system;

automatically creating the command sequence (Scenario_text_file) from the test procedure (ATP, Test_Procedure) such that the command sequence enables the test bench to be controlled for testing the electronic system by using the configuration database with the definitions contained therein for the all of the signals that might be exchanged by the pieces of equipment of the electronic system;

recording the informal functional specification (Functional_chain), the command sequence (Scenario_text_file), and at least one link (Link) which identifies an informal functional specification (Functional_chain) from which at least a portion of the command sequence (Scenario_text_file) was established, such that after executing the command sequence via controlling the test bench in application of the command sequence and recording the test results, it is possible to read the at least one link (Link) and identify unambiguously the informal functional specification(s) (Functional_chain) corresponding to the test results obtained;

wherein executing the command sequence via controlling the test bench in application of the command sequence and recording the test results includes executing the command sequence while checking and recording in an execution report (Res_File) the state of the electronic system compared with a description provided in the command sequence and automatically transcribing the results of the execution report into the test procedure with the links making it possible to identify the informal functional specifications for the electronic system that have been tested by executing the command sequence and that correspond to the test results obtained.

2. A method according to claim 1, in which the informal functional specification (Functional_chain) is recorded in the form of a text file.

3. A method according to claim 1, in which the command sequence (Scenario_text_file) is recorded in the form of a text file.

4. A method according to claim 1, in which each link (Link) comprises the address of a command sequence (Scenario_text_file) and the address of an informal functional specification (Functional_chain).

5. A method according to claim 1, in which the test procedure (ATP, Test_Procedure) contains function-for-testing objects (TestFunct).

6. A method according to claim 1, in which the test procedure (ATP, Test_Procedure) contains hierarchical organization data for function-for-testing objects (TestFunct).

7. A method according to claim 1, in which a program comprising code is recorded on a non-transitory medium or embodied by a non-transitory signal, the code being readable and/or executable by at least one data processor unit for simulating and testing the operation of an electronic system, the code including code segments for performing the operations of the method.

8. A method according to claim 1, in which a test system is used for testing an electronic system, in which the test system is programmed to perform the operations of the method.

* * * * *